(12) United States Patent
Pan et al.

(10) Patent No.: US 11,953,542 B2
(45) Date of Patent: Apr. 9, 2024

(54) TEST METHOD FOR TOLERANCE AGAINST THE HOT CARRIER EFFECT

(71) Applicant: CHANGXIN MEMORY TECHNOLOGIES, INC., Hefei (CN)

(72) Inventors: Yifei Pan, Hefei (CN); Xiaodong Luo, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 288 days.

(21) Appl. No.: 17/437,359

(22) PCT Filed: May 24, 2021

(86) PCT No.: PCT/CN2021/095601
§ 371 (c)(1),
(2) Date: Sep. 8, 2021

(87) PCT Pub. No.: WO2021/249176
PCT Pub. Date: Dec. 16, 2021

(65) Prior Publication Data
US 2023/0068128 A1    Mar. 2, 2023

(30) Foreign Application Priority Data
Jun. 8, 2020   (CN) .......................... 202010513669.6

(51) Int. Cl.
*G01R 31/26*     (2020.01)
*G01R 31/27*     (2006.01)
(Continued)

(52) U.S. Cl.
CPC ..... *G01R 31/2642* (2013.01); *G01R 31/2621* (2013.01); *G01R 31/275* (2013.01);
(Continued)

(58) Field of Classification Search
CPC .............. G01R 31/2642; G01R 31/275; G01R 31/2601; G01R 31/2621; G01R 31/2884;
(Continued)

(56) References Cited

U.S. PATENT DOCUMENTS

| 8,415,991 B2 | 4/2013 | Rangarajan et al. |
| 8,994,412 B2 | 3/2015 | Kim |

(Continued)

FOREIGN PATENT DOCUMENTS

| CN | 102017147 A | 4/2011 |
| CN | 101587162 B | 8/2011 |

(Continued)

OTHER PUBLICATIONS

International Search Report cited in PCT/CN2021/095601 dated Aug. 23, 2021, 10 pages.

(Continued)

*Primary Examiner* — Raul J Rios Russo
(74) *Attorney, Agent, or Firm* — Cooper Legal Group, LLC

(57) ABSTRACT

An embodiment of the present application provides a test method for tolerance against the hot carrier effect, applied to an I/O circuit of a memory, the I/O circuit having an output terminal, comprising: controlling the output terminal to alternately output a first level and a second level, the first level being higher than the second level; obtaining a degradation rate of an output performance parameter of the I/O circuit according to the first level and the second level; and obtaining tolerance of the I/O circuit against the hot carrier effect based on the degradation rate.

8 Claims, 1 Drawing Sheet

(51) Int. Cl.
   *G01R 31/28* (2006.01)
   *G11C 29/02* (2006.01)
   *H01L 21/66* (2006.01)

(52) U.S. Cl.
   CPC ........ *G01R 31/2884* (2013.01); *G11C 29/022* (2013.01); *H01L 22/34* (2013.01); *H01L 2924/00* (2013.01); *H01L 2924/0002* (2013.01)

(58) Field of Classification Search
   CPC .......... G11C 29/022; G11C 2029/5002; G11C 29/50; H01L 2924/00; H01L 2924/0002; H01L 22/34
   USPC ......... 324/71, 378, 403, 415, 425, 500, 537, 324/762.01, 762.09
   See application file for complete search history.

(56) References Cited

U.S. PATENT DOCUMENTS

| | | | |
|---|---|---|---|
| 9,159,796 B2 | 10/2015 | Mauder et al. | |
| 9,385,718 B1 | 7/2016 | Liu et al. | |
| 10,297,703 B2 | 5/2019 | Tian et al. | |
| 2003/0042926 A1* | 3/2003 | Rost | G01R 31/287 |
| | | | 324/762.02 |
| 2013/0015876 A1 | 1/2013 | Lai et al. | |
| 2015/0042372 A1* | 2/2015 | Pan | G01R 31/2621 |
| | | | 324/762.01 |
| 2017/0350938 A1* | 12/2017 | Kang | G01R 31/2874 |
| 2020/0132749 A1 | 4/2020 | Ryu et al. | |
| 2022/0349932 A1* | 11/2022 | Wang | G01R 19/10 |

FOREIGN PATENT DOCUMENTS

| | | | | |
|---|---|---|---|---|
| CN | 103376395 A | 10/2013 | | |
| CN | 103516350 A | 1/2014 | | |
| CN | 203811768 U | 9/2014 | | |
| CN | 104168008 A | 11/2014 | | |
| CN | 102347215 B | 4/2015 | | |
| CN | 106533406 | * | 3/2017 | ......... G01R 31/2621 |
| CN | 106533406 A | 7/2017 | | |
| CN | 108051722 A | 5/2018 | | |
| CN | 111105837 A | 5/2020 | | |

OTHER PUBLICATIONS

Jiangsheng, et al., "A Study of Hot-Carrier Effects in Nmosfet At Low Temperature", Aug. 30, 1990, vol. 18, No. 3, 22-26, 5 pages.
First Office Action cited in CN202010513669.6, dated Apr. 25, 2022, 18 pages.

* cited by examiner

TEST METHOD FOR TOLERANCE AGAINST THE HOT CARRIER EFFECT

CROSS-REFERENCE TO RELATED APPLICATIONS

The present application claims the priority to Chinese Patent Application 202010513669.6, titled "TEST METHOD FOR TOLERANCE AGAINST THE HOT CARRIER EFFECT", filed on Jun. 8, 2020, which is incorporated herein by reference in its entirety.

TECHNICAL FIELD

Embodiments of the present application relate to the field of semiconductors, and in particular, to a test method for tolerance against the hot carrier effect.

BACKGROUND

With the popularization and application of electronic devices, people have put forward higher requirements on the performance of electronic devices, for example, the stability of the performance of semiconductor devices in electronic devices. In order to ensure that semiconductor devices can work reliably for a long period time, the semiconductor devices are usually subjected to performance tests, such as ageing, before they are delivered, thus to ensure that the change in the performance of the semiconductor devices is within a preset threshold within a preset period of time.

At present, there is no simple and effective test method for tolerance against the hot carrier effect of semiconductor devices.

SUMMARY

An embodiment of the present application provides a test method for tolerance against the hot carrier effect, applied to an I/O circuit of a memory, the I/O circuit having an output terminal, comprising: controlling the output terminal to alternately output a first level and a second level, the first level being higher than the second level; obtaining degradation rates of output performance parameters of the I/O circuit according to the first level and the second level; and obtaining the tolerance against the hot carrier effect of the I/O circuit based on the degradation rates.

The technical solution in the embodiment of the present application has the following advantages:

In the technical solution, by alternately outputting the first level and the second level, the I/O circuit is continuously influenced by the hot carrier effect, eliminating the self-repairing of the I/O circuit in the idle state. Thus, the tolerance of the I/O circuit against the hot carrier effect can be accurately obtained according to the output performance parameter of the I/O circuit.

In addition, since only one of the PMOS transistor and the NMOS transistor is in the ON state at the same time, the output performance parameter of the I/O circuit at a certain moment are only influenced by one of the PMOS transistor and the NMOS transistor. Therefore, the tolerance against the hot carrier effect of the PMOS transistor and the NMOS transistor can be obtained respectively through the output performance parameter of the I/O circuit.

BRIEF DESCRIPTION OF THE DRAWINGS

One or more embodiments will be exemplified by pictures in the corresponding drawings. These exemplified descriptions do not constitute any limitation to the embodiments. Elements with the same reference numerals in the drawings are represented as similar. Unless otherwise stated, the drawings are not necessarily drawn to scale.

DETAILED DESCRIPTION

It is known from the background that there is a need for a simple and effective test method for tolerance against the hot carrier effect of a semiconductor device.

In order to solve the above-mentioned problem, an embodiment of the present application provides a test method for tolerance against the hot carrier effect, applied to an I/O circuit of a memory. By controlling the I/O circuit to alternately output the first level and the second level, the I/O circuit is continuously influenced by the hot carrier effect, eliminating the self-repairing of the I/O circuit in the idle state. Thus, the tolerance against the hot carrier effect of the I/O circuit can be accurately obtained according to the output performance parameter of the I/O circuit.

To make the objectives, technical solutions and advantages of the embodiments of the present application clearer, the embodiments of the present application will be further described below in detail with reference to the accompanying drawings. However, it may be understood by a person of ordinary skill in the art that, in the embodiments of the present application, many technical details are provided for the better understanding of the present application. However, the technical solutions sought to be protected by the present application can be implemented, even without these technical details and various changes and modifications based on the following embodiments.

In this embodiment, the test method for the tolerance against the hot carrier effect is applied to an I/O circuit of a memory. The test method for tolerance against the hot carrier effect will be described in detail below on the basis of an I/O circuit of a memory.

Figure 1:
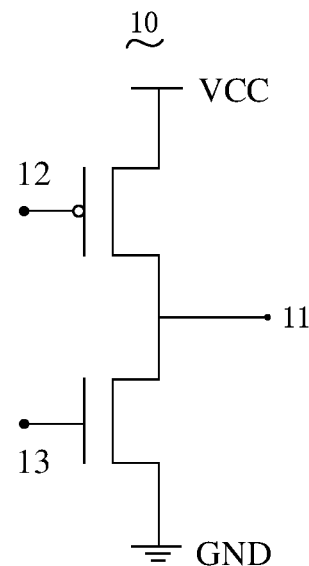
FIG. 1 is an I/O circuit of a memory according to an embodiment of the present application.

FIG. 1 is an I/O circuit of a memory according to an embodiment of the present application.

The I/O circuit 10 has an output terminal 11. The I/O circuit 10 comprises a PMOS transistor 12 and an NMOS transistor 13. The output terminal 11 is respectively connected to the drain of the PMOS transistor 12 and the drain of the NMOS transistor 13, the source of the PMOS transistor 12 is connected to a operating power supply VCC, and the source of the NMOS transistor 13 is grounded, that is, connected to the ground GND.

In this embodiment, the test method for tolerance against the hot carrier effect comprises the following steps:

S1: The output terminal 11 is controlled to alternately output a first level and a second level, the first level being higher than the second level.

In this embodiment, the operating temperature of the I/O circuit 10 is lower than room temperature. At a temperature lower than room temperature (hereinafter referred to as low temperature), the atomic vibration of silicon atoms in the channel region of the MOS transistor becomes weaker, and the collision of carriers with silicon atoms is reduced when operating in an electric field. Therefore, it is easier for the carriers to obtain kinetic energy, which exceeds the barrier height of silicon-silicon dioxide, to enter the gate oxide layer, which in turn result in silicon-silicon dioxide interface damage and oxide traps. That is, at low temperature, the hot carrier effect is more obvious. In other words, testing at a temperature lower than room temperature is conducive to strengthening the influence of the hot carrier effect on the output performance parameter of the I/O circuit 10. Thus, the tolerance against the high-intensity hot carrier effect of the I/O circuit 10 is obtained.

In this way, by ensuring that the tolerance against the high-intensity hot carrier effect of the I/O circuit 10 meets the preset requirements, the stability of the I/O circuit 10 at room temperature and a temperature above room temperature can meet the preset requirements. In addition; testing at low temperature and then equivalently converting the test results at low temperature to test results at room temperature or other temperatures is beneficial to speed up the test and improve the test efficiency.

In other embodiments, the initial operating temperature of the I/O circuit is lower than room temperature. In the subsequent operating process, the operating temperature of the I/O circuit may rise due to the heating of the hot carrier effect. The influence of the heating of the hot carrier effect on the output performance parameter of the I/O circuit belongs to the marginal effect of the hot carrier effect. Summarizing the influence of the marginal effect of the hot carrier effect in the influence of the hot carrier effect is conducive to more accurately obtain the output performance parameter of the I/O circuit under actual operating conditions, and then accurately obtain the tolerance of the I/O circuit under actual operating conditions.

It should be noted that the marginal effect refers to the influence of other physical phenomena caused by the hot carrier effect on the output performance parameter of the I/O circuit. Derivative phenomena include but are not limited to heat generation and leakage current.

In this embodiment, at a previous moment, the PMOS transistor 12 is controlled to be turned on and the NMOS transistor 13 is controlled to be turned off to enable the output terminal 11 to output the first level; and at a later moment, the PMOS transistor 12 is controlled to be turned off and the NMOS transistor 13 is controlled to be turned on to enable the output terminal 11 to output the second level. That is, by controlling the working states of the PMOS transistor 12 and the NMOS transistor 13 at different moments, the output terminal 11 of the I/O circuit 10 alternately outputs the first level and the second level.

For example, by controlling the memory to perform burst transmission, the output terminal 11 alternately outputs the first level and the second level. Burst transmission refers to continuous data transmission in a short period of time.

S2: degradation rates of output performance parameters of the I/O circuit 10 are obtained according to the first level and the second level.

In this embodiment, the output performance parameter comprises at least one of a voltage maximum and minimum parameter or a level conversion rate parameter. The voltage maximum and minimum parameter comprises a voltage peak parameter and a voltage valley parameter, which correspond to the first level parameter and the second level parameter in this embodiment. The level conversion rate parameter comprise a level rising edge conversion rate degradation rate and a level falling edge conversion rate degradation rate. The level rising edge refers to the level conversion of the output level from a lower second level to a higher first level, and the level falling edge refers to the level conversion of the output level from a higher first level to a lower second level. The conversion rate refers to the rate of rising or falling.

As the test progresses, the hot carrier effect will cause damage to the gate dielectric layer of the PMOS transistor 12 and the NMOS transistor 13, which in turn causes the degradation of the performance parameter of the PMOS transistor 12 and the NMOS transistor 13. The degradation of the performance parameter of the PMOS transistor 12 and the NMOS transistor 13 will correspondingly cause the degradation of the output performance parameter of the I/O circuit 10. That is, the degradation of the output performance parameter of the I/O circuit 10 comprises the degradation of the performance parameter of the PMOS transistor 12 and the degradation of the performance parameter of the NMOS transistor 13.

In this embodiment, since the PMOS transistor 12 is turned on and the NMOS transistor 13 is turned off when the first level is output, the first level parameter is related to only the operating power supply VCC and the performance parameter of the PMOS transistor 12. Therefore, by controlling the voltage stability of the operating power supply VCC, the change in the first level parameter (that is, the level peak) is related to only the change in the performance parameter of the PMOS transistor 12. In other words, the change in the performance parameter of the PMOS transistor 12 may be characterized by the change in the level peak parameter.

Correspondingly, when the second level is output, since the NMOS transistor 13 is grounded, that is, the level at the drain of the NMOS transistor 13 is fixed, the parameter of the second level output by the output terminal 11 is related to only the performance parameter of the NMOS transistor 13, and the degradation of the parameter of the second level (i.e., the level valley) is related to only the degradation of the performance of the NMOS transistor 13. In other words, the performance parameter degradation rate of the NMOS transistor 13 may be characterized by the level valley degradation rate.

In this embodiment, when the level at the output terminal 11 of the I/O circuit 10 rises from the second level to the first level, the PMOS transistor 12 is gradually turned on, the NMOS transistor 13 is turned off, and the change rate of the level output by the output terminal 11 is related to only the turn-on rate of the PMOS transistor 12. Since the turn-on rate of the PMOS transistor 12 is related to the damage caused by the hot carrier effect to the gate dielectric layer of the PMOS transistor 12, the greater the damage, the more severe the performance degradation, and the slower the turn-on rate of the PMOS transistor 12. Therefore, the current performance parameter of the PMOS transistor 12 may be characterized by the level rising edge conversion rate, and the performance parameter degradation rate of the PMOS transistor 12 may be characterized by the level rising edge conversion rate degradation rate.

Correspondingly, when the level at the output terminal 11 of the I/O circuit 10 drops from the first level to the second level, the NMOS transistor 13 is gradually turned on and the PMOS transistor 12 is turned off. Since, when the PMOS transistor 12 is turned off, that is, when the gate voltage of the PMOS transistor 12 returns to zero, some of moving carriers in the channel region will continue moving. Therefore, after the PMOS transistor 12 is turned off for a period of time, the level output by the output terminal 11 is not zero, and within this period of time, the change in the output performance of the output terminal 11 is related to only the turn-on rate of the NMOS transistor 13. Since the turn-on rate of the NMOS transistor 13 is related to the damage caused by the hot carrier effect to the gate dielectric layer of the NMOS transistor 13, the greater the damage, the more severe the performance degradation, and the slower the turn-on rate of the NMOS transistor 13. Therefore, the current performance parameter of the NMOS transistor 13 may be characterized by the level falling edge conversion rate, and the performance parameter degradation rate of the NMOS transistor 13 may be characterized by the level falling edge conversion rate degradation rate.

In this embodiment, when the memory is controlled to perform burst transmission, the burst length of the burst transmission may be taken as a time detection unit to obtain the output level of the output terminal 11 of the I/O circuit 10.

S3: The tolerance against the hot carrier effect of the I/O circuit is obtained based on the degradation rates.

In this embodiment, the tolerance against the hot carrier effect of the I/O circuit 10 is obtained based on at least one of the level maximum and minimum degradation rate or the level conversion rate degradation rate.

In this embodiment, at least one of the voltage peak degradation rate or the level rising edge conversion rate degradation rate may be used to characterize the degradation rate of the PMOS transistor 12, and the degradation rate is used to characterize the tolerance against the hot carrier effect. The first tolerance against the hot carrier effect of the PMOS transistor 12 may be obtained based on at least one of the voltage peak degradation rate or the level rising edge conversion rate degradation rate. Similarly, the second tolerance against the hot carrier effect of the NMOS transistor 13 may be obtained based on at least one of the voltage valley degradation rate or the level falling edge conversion rate degradation rate.

It should be noted that, since the number of carriers in the NMOS transistor 13 is greater than the number of carriers in the PMOS transistor 12, the second tolerance against the hot carrier effect and the first tolerance against the hot carrier effect may be different. By the test method according to the present application, the specific manifestation of this difference may be accurately measured.

Figure 2:
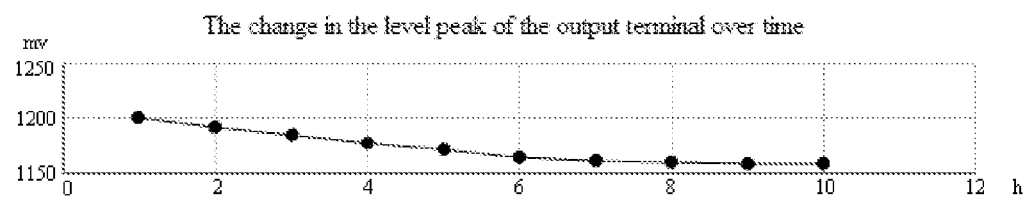
FIG. 2 is a schematic view of the change in the level peak of the output terminal over time, according to an embodiment of the present application.
Figure 3:
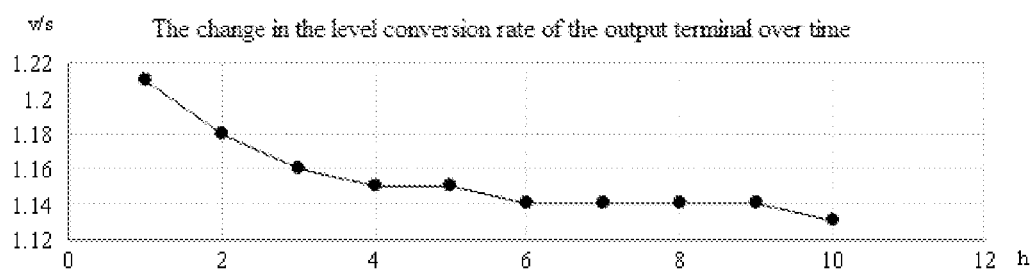
FIG. 3 is a schematic view of the change in the level conversion rate of the output terminal over time, according to an embodiment of the present application.

FIG. 2 is a schematic view of the change in the level peak of the output terminal over time, according to an embodiment of the present application. FIG. 3 is a schematic view of the change in the level conversion rate of the output terminal over time, according to an embodiment of the present application.

As shown in FIG. 2, after 6 hours of testing, the level peak output performance of the I/O circuit 10 is basically no longer influenced by the hot carrier effect. Within 6 hours, the influence of the hot carrier effect on the peak level output performance is less than 5% of the original parameter. As shown in FIG. 3, after 4 hours of testing and 6 hours of testing, there is a period of time in which the level conversion rate of the I/O circuit 10 tends to be stable, respectively. But, when the test continues, the level conversion rate degrades continuously.

In this embodiment, by alternately outputting the first level and the second level, the I/O circuit is continuously affected by the hot carrier effect, eliminating the self-repairing of the I/O circuit in the idle state. Thus, the tolerance against the hot carrier effect of the I/O circuit can be accurately obtained according to the output performance parameter of the I/O circuit.

It may be understood by a person of ordinary skill in the art that the above-mentioned implementations are specific embodiments for realizing the present application, and in actual applications, various changes may be made to the form and details without departing from the spirit and scope of the present application. Those skilled in the art can make their own changes and modifications without departing from the spirit and scope of the present application. Therefore, the protection scope of the present application shall be subject to the scope defined by the claims.

The invention claimed is:

1. A test method for tolerance against a hot carrier effect, applied to an input/output (I/O) circuit of a memory, the I/O circuit having an output terminal, and the I/O circuit comprising a p-channel metal-oxide semiconductor (PMOS) transistor and an n-channel metal-oxide semiconductor (NMOS) transistor, the output terminal being respectively connected to a drain of the PMOS transistor and a drain of the NMOS transistor, a source of the PMOS transistor being connected to an operating power supply, and a source of the NMOS transistor being grounded; and the test method for tolerance against the hot carrier effect comprising:

controlling the output terminal to alternately output a first level and a second level, comprising: at a previous moment, the PMOS transistor being controlled to be turned on and the NMOS transistor being controlled to be turned off, to enable the output terminal to output the first level; and at a latter moment, the PMOS transistor being controlled to be turned off and the NMOS transistor being controlled to be turned on to enable the output terminal to output the second level; wherein the first level is higher than the second level;

obtaining degradation rates of output performance parameters of the I/O circuit according to the first level and the second level, wherein the degradation rates comprise at least one of a level maximum and minimum degradation rate or a level conversion rate degradation rate, and the level conversion rate degradation rate comprises a level rising edge conversion rate degradation rate and a level falling edge conversion rate degradation rate; and obtaining a first tolerance against the hot carrier effect of the PMOS transistor and a second tolerance against the hot carrier effect of the NMOS transistor, based on the degradation rates.

2. The test method according to claim 1, wherein the level maximum and minimum degradation rate comprises a level peak degradation rate and a level valley degradation rate.

3. The test method according to claim 1, wherein the degradation rates comprise a level peak degradation rate; and the obtaining a first tolerance against the hot carrier effect of the PMOS transistor comprises: obtaining the first tolerance against the hot carrier effect based on the level peak degradation rate.

4. The test method according to claim 1, wherein the degradation rates comprise the level rising edge conversion rate degradation rate; and the obtaining a first tolerance against the hot carrier effect of the PMOS transistor comprises:

obtaining the first tolerance against the hot carrier effect based on the level rising edge conversion rate degradation rate.

5. The test method according to claim 1, wherein the degradation rates comprise a level valley degradation rate; and the obtaining a second tolerance against the hot carrier effect of the NMOS transistor comprises: obtaining the second tolerance against the hot carrier effect based on the level valley degradation rate.

6. The test method according to claim 1, wherein the degradation rates comprise the level falling edge conversion rate degradation rate; and the obtaining a second tolerance against the hot carrier effect of the NMOS transistor comprises: obtaining the second tolerance against the hot carrier effect based on the level falling edge conversion rate degradation rate.

7. The test method according to claim 1, wherein an operating temperature of the I/O circuit is lower than a room temperature.

8. The test method according to claim 1, wherein the controlling the output terminal to alternately output a first level and a second level comprises: controlling the memory to perform a burst transmission so that the output terminal alternately outputs the first level and the second level; and obtaining degradation rates of output performance parameters of the I/O circuit comprises: by taking a burst length of the burst transmission as a detection time unit, obtaining a plurality of output levels of the output terminal in a plurality of detection time units; and obtaining the degradation rates of the output performance parameters of the I/O circuit according to the output levels.

\* \* \* \* \*